(12) United States Patent
Yamakawa et al.

(10) Patent No.: US 7,527,984 B2
(45) Date of Patent: May 5, 2009

(54) SEMICONDUCTOR DEVICE

(75) Inventors: Koji Yamakawa, Tokyo (JP); Soichi Yamazaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 198 days.

(21) Appl. No.: 11/482,909

(22) Filed: Jul. 10, 2006

(65) Prior Publication Data
US 2007/0080383 A1    Apr. 12, 2007

(30) Foreign Application Priority Data
Oct. 6, 2005    (JP) .............................. 2005-293440

(51) Int. Cl.
    *H01L 21/00*    (2006.01)
(52) U.S. Cl. ........................... 438/3; 438/381; 257/295; 257/E27.048
(58) Field of Classification Search ................. 438/239, 438/381, 396, 3; 257/295, E27.048
See application file for complete search history.

(56) References Cited

U.S. PATENT DOCUMENTS

| | | | |
|---|---|---|---|
| 6,342,425 B1 * | 1/2002 | Joo | 438/396 |
| 7,001,821 B2 * | 2/2006 | Aggarwal et al. | 438/396 |
| 2004/0155279 A1 | 8/2004 | Kutsunai et al. | |
| 2004/0185635 A1 * | 9/2004 | Tatsunari | 438/396 |
| 2004/0212041 A1 * | 10/2004 | Takamatsu et al. | 257/534 |
| 2005/0230727 A1 * | 10/2005 | Tamura et al. | 257/295 |

FOREIGN PATENT DOCUMENTS

| | | |
|---|---|---|
| JP | 2002-324892 | * 11/2002 |
| JP | 2005-64342 | 3/2005 |

\* cited by examiner

*Primary Examiner*—Asok K Sarkar
*Assistant Examiner*—Julia Slutsker
(74) *Attorney, Agent, or Firm*—Finnegan, Henderson, Farabow, Garrett & Dunner, L.L.P.

(57) ABSTRACT

A semiconductor device according to an embodiment of the present invention includes a semiconductor substrate; a ferroelectric capacitor arranged above the semiconductor substrate; an insulating protecting film covering a side surface of the ferroelectric capacitor; and a side wall film formed on a side surface of the ferroelectric capacitor through the protecting film and giving tensile stress to the ferroelectric capacitor in a direction of an electric field applied to the ferroelectric capacitor.

15 Claims, 6 Drawing Sheets

300

500

SEMICONDUCTOR DEVICE

CROSS-REFERENCE TO RELATED APPLICATION

This application is based upon and claims the benefit of priority from the prior Japanese Patent Applications No. 2005-293440, filed on Oct. 6, 2005, the entire contents of which are incorporated herein by reference.

BACKGROUND OF THE INVENTION

1. Field of the Invention

The present invention relates to a semiconductor device.

2. Related Art

A degree of integration of a ferroelectric memory having a ferroelectric capacitor is increasingly advanced. Accordingly, the size of the ferroelectric capacitor is decreased from several microns to submicrons. When the ferroelectric capacitor is micropatterned, an amount of residual polarization of the ferroelectric capacitor decreases. The micropatterned ferroelectric capacitor is easily damaged in hard mask formation in CVD (Chemical Vapor Deposition), processing of the capacitor in the RIE (Reactive Ion Etching), formation of an insulating interlayer in CVD, or the like in steps of manufacturing the capacitor. By the process damage, an amount of residual polarization of the ferroelectric capacitor also decreases. The decrease in amount of residual polarization is caused by fixed charges such as hydrogen trap or oxygen deficit occurring in a ferroelectric film of the ferroelectric capacitor or on an interface between an electrode and the ferroelectric film. Characteristic deterioration such as a decrease in amount of residual polarization degrades the reliability of the ferroelectric memory.

When the ferroelectric capacitor has a size of a sub-micron level, an amount of polarization of the ferroelectric capacitor becomes unstable because of an influence from a peripheral portion of the ferroelectric capacitor. In particular, when the ferroelectric capacitor is operated with a low voltage, the ferroelectric film must be thin. When the thin ferroelectric film is to be used, it is important to thermally or temporally stabilize the amount of polarization of the ferroelectric capacitor.

SUMMARY OF THE INVENTION

A semiconductor device according to an embodiment of the present invention includes a semiconductor substrate; a ferroelectric capacitor arranged above the semiconductor substrate; an insulating protecting film covering a side surface of the ferroelectric capacitor; and a side wall film formed on a side surface of the ferroelectric capacitor through the protecting film and giving tensile stress to the ferroelectric capacitor in a direction of an electric field applied to the ferroelectric capacitor.

A semiconductor device according to an embodiment of the present invention includes a semiconductor substrate; a plurality of ferroelectric capacitors arranged above the semiconductor substrate; and a buried film buried between the adjacent ferroelectric capacitors and giving compression stress to the ferroelectric capacitors in a direction perpendicular to a direction of an electric field applied to the ferroelectric capacitors.

A semiconductor device according to an embodiment of the present invention includes a semiconductor substrate; a ferroelectric capacitor having a ferroelectric film between an upper electrode and a bottom electrode and arranged above the semiconductor substrate; an upper stress film provided on the upper electrode; and a bottom stress film provided under the bottom electrode, wherein the upper electrode and the bottom electrode give compression stress to the ferroelectric capacitor in a direction perpendicular to a direction of an electric field applied to the ferroelectric capacitor.

A semiconductor device according to an embodiment of the present invention includes a semiconductor substrate; a ferroelectric capacitor arranged above the semiconductor substrate; a piezoelectric substance provided on the side surfaces of the ferroelectric capacitor and applying stress to the ferroelectric capacitor from the side surfaces of the ferroelectric capacitor.

A semiconductor device according to an embodiment of the present invention includes a semiconductor substrate; a first electrode arranged above the semiconductor substrate; a ferroelectric film provided on a side surface of the first electrode; a second electrode which is adjacent to the ferroelectric film and which gives compression stress to the ferroelectric film in a direction perpendicular to a direction of an electric field applied to the ferroelectric capacitor.

A semiconductor device according to an embodiment of the present invention includes a semiconductor substrate; a ferroelectric capacitor arranged above the semiconductor substrate; a first stress film covering a upper surface and side surfaces of the ferroelectric capacitor and giving compression stress to the ferroelectric capacitor.

A method of manufacturing a semiconductor device according to an embodiment of the present invention includes depositing an insulating film on a semiconductor substrate; forming a contact on the insulating film; forming a ferroelectric capacitor by sequentially depositing a lower electrode, a ferroelectric film, and an upper electrode on the contact; isotropically depositing a first stress film giving tensile stress on upper and side surfaces of the ferroelectric capacitor in a parallel direction to a interface between the ferroelectric capacitor and the first stress film; and anisotropically depositing a second stress film giving compression stress on the upper surface of the ferroelectric capacitor in a parallel direction to a interface between the first stress film and the second stress film .

DETAILED DESCRIPTION OF THE INVENTION

Embodiments according to the present invention will be described below with reference to the accompanying drawings. The embodiments do not limit the present invention. In the embodiments (will be described below), a ferroelectric memory is, for example, a "TC parallel unit serial-connection-type ferroelectric memory". The TC parallel unit serial-connection-type memory is a memory which consists of series connected memory cells each having a transistor having a source terminal and a drain terminal and a ferroelectric capacitor in between said two terminals.

FIRST EMBODIMENT

Figure 1:
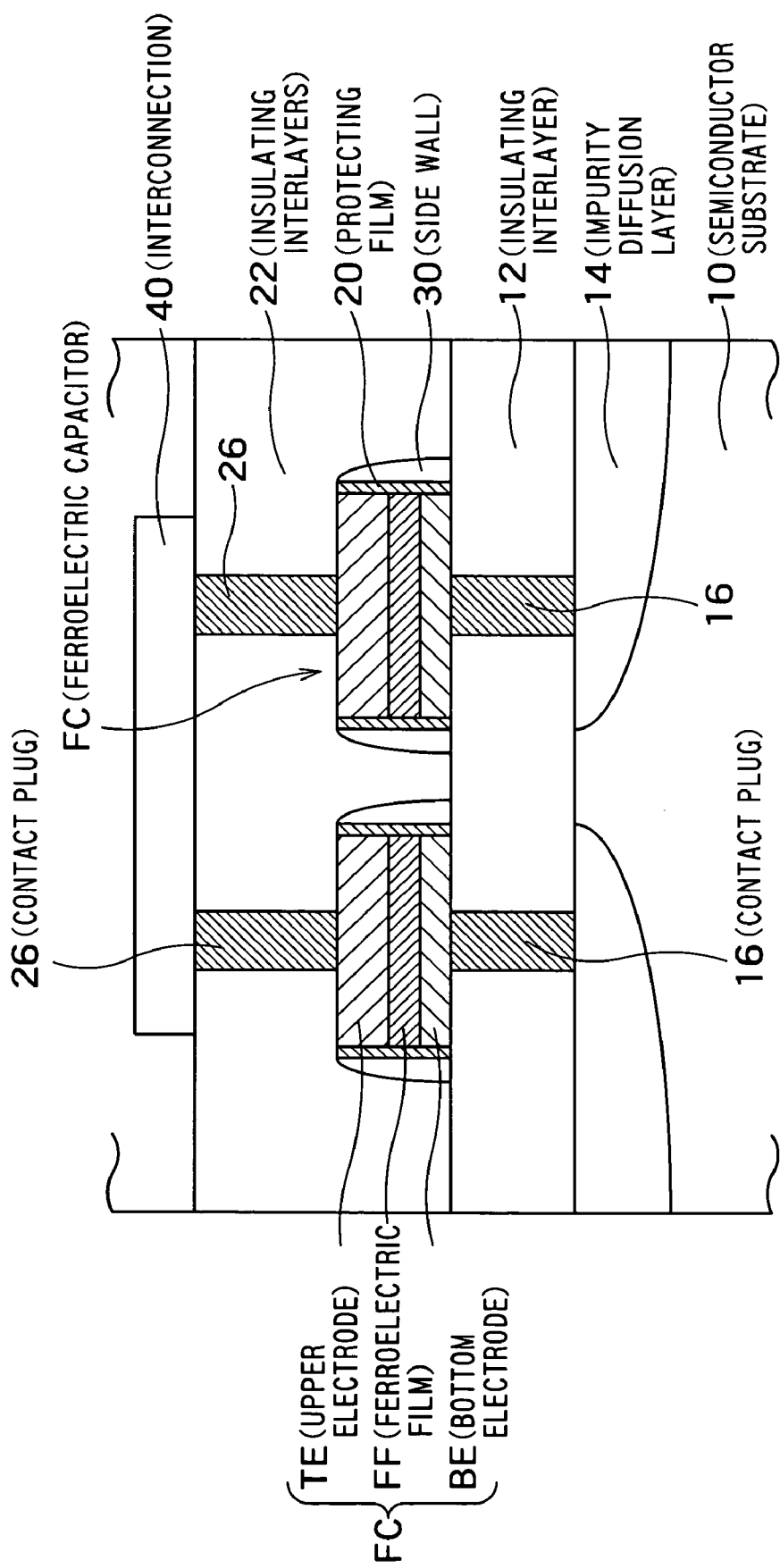
FIG. 1 is a sectional view showing a configuration of a ferroelectric memory 100 according to a first embodiment.

FIG. 1 is a sectional view showing a configuration of a ferroelectric memory 100 according to a first embodiment of the present invention. The ferroelectric memory 100 includes a semiconductor substrate 10, insulating interlayers 12 and 22, a ferroelectric capacitor FC, an insulating protecting film 20, and a side wall film 30. In the ferroelectric memory 100, a capacitor structure shown in FIG. 1 is included in each of unit cells, and the unit cells are connected in series with each other.

The semiconductor substrate 10 is, for example, a p-type silicon substrate. In the semiconductor substrate 10, an STI (Shallow Trench Isolation) (not shown) is formed. In an active region except for the STI, a cell transistor (not shown) is formed. The cell transistor is constituted by a gate gap film constituted by a gate insulating film, a gate electrode (word line), and a silicon nitride film, a gate side wall film, and source/drain diffusion layers. The gate electrode has, for example, a polyside structure constituted by polysilicon and $WSi_2$ films. The source/drain diffusion layers are electrically connected to impurity diffusion layers 14. The source/drain diffusion layers may partially constitute the impurity diffusion layers 14.

The multi-layered insulating interlayer 12 including a silicon nitride film and a silicon oxide film is formed to cover the cell transistors.

In the insulating interlayer 12, a contact plug 16 is formed. The contact plug 16 electrically connects a bottom electrode BE of the ferroelectric capacitor FC and the impurity diffusion layer 14 to each other. When a barrier film is formed, the contact plug 16 electrically connects between the barrier film and the impurity diffusion layer 14.

The ferroelectric capacitor FC is provided on the insulating interlayer 12. The ferroelectric capacitor FC includes the bottom electrode BE, a ferroelectric film FF, and an upper electrode TE. A voltage is given to the bottom electrode BE and the upper electrode TE to make it possible to give an electric field to the ferroelectric film FF. The ferroelectric film FF consists of a ferroelectric material such as PZT (Pb$(Zr_xTi_{1-x})O_3$), BIT ($Bi_4Ti_3O_{12}$), SBT ($SrBi_2Ta_2O_9$), or a material obtained by adding Nb to SBT, or BLT ($Bi, La)_4Ti_3O_{12}$. The ferroelectric film FF may consists of a ferroelectric complex oxide such as PZT added with various additive elements or PLZT added with various additive elements. Each of these ferroelectric materials has a crystal structure based on a perovskite structure and residual polarization which can be used as a nonvolatile memory. The ferroelectric film FF may be formed by using a sputtering method, an MOCVD method, or a sol-gel method matched with other semiconductor memory manufacturing steps. A conductive barrier film (not shown) may be formed below the bottom electrode BE.

An oxide ferroelectric substance is formed by using an oxygen atmosphere, and, in order to improve the reliability of the capacitor such as a fatigue characteristic, a retention characteristic, and an imprint characteristic, the bottom electrode BE consists of a noble metal, a noble metal oxide, or a conductive oxide such as Pt, Ir, $IrO_2$, Ru, or $RuO_2$. The upper electrode TE consists of a noble metal, a noble metal oxide, a conductive complex oxide typified by a perovskite structure, for example, Pt, Ir, $IrO_2$, Ru, $RuO_2$, $SrRuO_3$ (SR), $LaNiO_3$ (LNO), (La, Sr) $CoO_3$, YBCO (superconducting material), a layered product consisting of SRO and $IrO_x$, or the like. In particular, $IrO_2$ is popularly used as an upper electrode of a PZT film to suppress process damage to a capacitor in formation of the side wall film 30 or formation of an insulating interlayer.

The ferroelectric capacitor FC is formed as follows. Materials of the bottom electrode BE, the ferroelectric film FF, and the upper electrode TE are deposited on the insulating interlayer 12. A material of a hard mask is deposited on the material of the upper electrode TE. A photolithography technique and RIE are used to process the hard mask in a pattern of the ferroelectric capacitor FC. At this time, the RIE is executed at a room temperature by using a halogen-based gas such as $CHF_3$ or $CF_4$.

The upper electrode TE is processed by RIE using the hard mask. When the upper electrode TE is an $IrO_2$ film, a gas mixture of $Cl_2$, $O_2$, Ar, and the like at a temperature ranging from 250° C. to 400° C.

The ferroelectric film FF is processed by the RIE using the hard mask. When the ferroelectric film FF consists of the PZT, the RIE is executed at a temperature ranging from 250° C. to 400° C. in a gas mixture atmosphere using a halogen gas such as $Cl_2$, $CF_4$, $O_2$, or Ar as a base.

Furthermore, the bottom electrode BE is processed by the RIE using the hard mask. When the bottom electrode BE is an Ir film, the RIE is executed in an atmosphere of a gas mixture using a halogen gas a base at a temperature ranging from 250° C. to 400° C. When the bottom electrode BE is a Ti film, the RIE is executed in an atmosphere of a gas mixture of $Cl_2$ and Ar. In this manner, the ferroelectric capacitor FC is formed. A vapor pressure of a compound of an element constituting a ferroelectric film or a noble element used in the electrode material can be increased by high-temperature RIE. Therefore, a taper angle of a capacitor side wall can be increased without forming a fence.

The protecting film 20 is formed to cover the side surface of the ferroelectric capacitor FC. The protecting film 20 consists of an insulating material to maintain the insulating property between the upper electrode TE and the bottom electrode BE. The protecting film 20 is, for example, an alumina ($Al_2O_3$) film, an Si oxide film, a titania ($TiO_x$), an Si nitride film (SiN) film, or the like. A ferroelectric film such as PZT or a high-dielectric-constant film such as BST can be used as the protecting film 20. The protecting film 20 prevents reductive hydrogen from being mixed in the ferroelectric film FF when the side wall film 30 is formed. In this manner, the polarization characteristic of the ferroelectric film FF is suppressed from being deteriorated.

The side wall film 30 is formed on a side surface of the ferroelectric capacitor FC through the protecting film 20. The side wall film 30 gives a tensile stress to the ferroelectric capacitor FC in the direction of an electric field applied to the ferroelectric capacitor FC. The direction of the electric field is a direction from the upper electrode TE to a direction from the bottom electrode BE or a direction from the bottom electrode BE to the upper electrode TE. In other words, the side wall film 30 gives a tensile stress in a direction of a polarization axis of the ferroelectric film FF. For example, the side wall film 30 is a silicon nitride film or the like having a compression stress over 1 gigapascal.

The side wall film 30 itself tends to expand. The protecting film 20 and the ferroelectric capacitor FG adjacent to the side wall film 30 do not expand. For this reason, the side wall film 30 has compression stress therein and relatively gives tensile stress to the protecting film 20 and the ferroelectric capacitor FG adjacent to the side wall film 30.

The side wall film 30 may be a silicon nitride film (plasma nitride) formed by plasma CVD (Chemical Vapor Deposition) or a silicon nitride film formed by depositing polysilicon and then nitrified the polysilicon.

The ferroelectric capacitor FC is further covered with the insulating interlayer 22. In the insulating interlayer 22, a contact plug 26 is formed. The contact plug 26 electrically connects the upper electrode TE of the ferroelectric capacitor FC and an interconnection 40 on the insulating interlayer 22.

In the capacitor structure shown in FIG. 1, the upper electrodes of the adjacent ferroelectric capacitors FC are electrically connected to each other by the interconnection 40. The ferroelectric capacitor FC illustrated is electrically connected to a ferroelectric capacitor (not shown) adjacent to the right or left side of the ferroelectric capacitor FC through the impurity diffusion layer 14. The capacitor structures are repeated to constitute the ferroelectric memory.

In the embodiment, the side wall film 30 consisting of plasma nitride gives a tensile stress to a side wall of the ferroelectric capacitor FC. The side wall film 30 is formed such that nitride is deposited by using plasma CVD to cover the ferroelectric capacitor FC, and the nitride is anisotropically etched by RIE. The plasma nitride changes in stress state when a film forming pressure, a plasma power, and a post-process in the plasma CVD. By using this, the side wall film 30 is formed under process conditions which give tensile stress to a side wall of the ferroelectric capacitor FC. As the film forming conditions of the plasma nitride having compression stress, a low RF power of 0.5 to 1.0 kW or less, a low pressure, a low discharge frequency of 400 kHz, and the like are used in an $SiH_4/NH_3/N_2$-based gas. Under the film forming conditions, ion impacts increase, a residual hydrogen concentration in the film decreases, and a dense film having compression stress can be formed.

In a conventional art, since an amount of polarization decreases by hydrogen radicals, nitride cannot be formed on a side surface of the ferroelectric capacitor. However, in the embodiment, the protecting film 20 covers the side wall of the ferroelectric capacitor FC. Therefore, hydrogen radicals generated in formation of the side wall film 30 do not diffuse in the ferroelectric capacitor FC. As a result, the amount of polarization of the ferroelectric capacitor FC is suppressed from decreasing.

Furthermore, the side wall film 30 is arranged on the side wall of the ferroelectric capacitor FC to give tensile stress in a direction (direction of polarization axis) in which an electric field is applied to the ferroelectric capacitor FC. In this manner, the lattice of the ferroelectric film FF can be distorted, and an amount of polarization of the ferroelectric capacitor FC can be increased. For example, the size of the ferroelectric capacitor FC was given by 0.5 μm×0.5 μm, the amount of polarization of the ferroelectric capacitor FC was about 30 $\mu C/cm^2$. This amount of polarization is sufficient large in consideration of a fatigue characteristic, a retention characteristic, and an imprint characteristic in normal use. The fatigue characteristic of the capacitor was evaluated by using an array-like test pattern. The amount of polarization did not change up to $1 \times 10^{12}$ cycles. One cycle means one execution of writing/erasing (W/E). A leakage current was low, i.e., about $10^{-7}$ $A/cm^2$ when an applied voltage was 2.5 V. For this reason, an Si nitride film was used as a stress-applied film, it was confirmed that the capacitor was not deteriorated in processes and that deterioration of reliability such as a fatigue characteristic and deterioration of electric characteristics such as an electric characteristic did not occur.

In this manner, in the embodiment, an amount of polarization of the ferroelectric capacitor FC can be increased while being suppressed from decreasing. Furthermore, the embodiment can improve the fatigue characteristic of the ferroelectric capacitor FC can be improved. As a result, the ferroelectric memory can be improved in reliability.

SECOND EMBODIMENT

Figure 2:
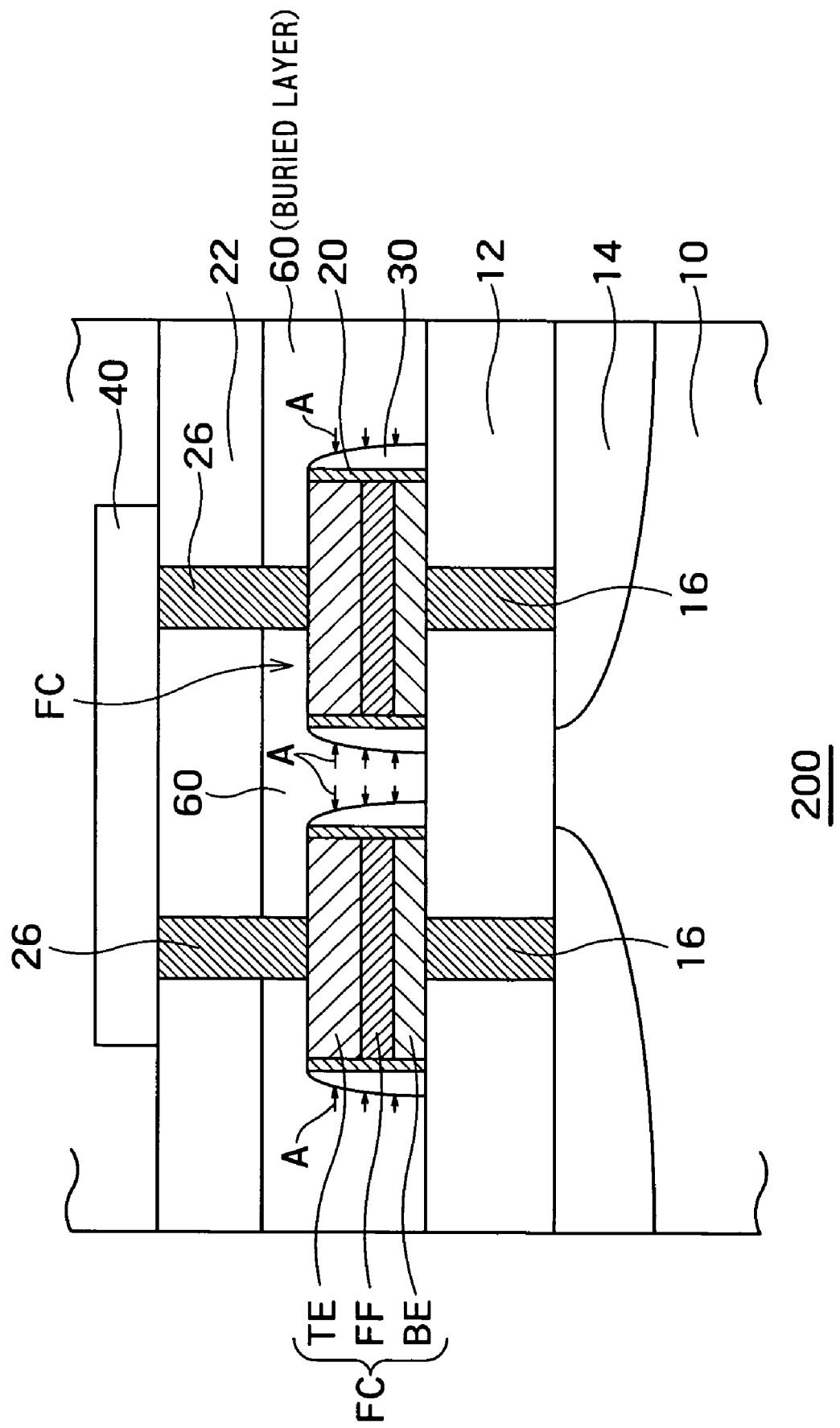
FIG. 2 is a sectional view showing a configuration of a ferroelectric memory 200 according to a second embodiment.

FIG. 2 is a sectional view showing a configuration of a ferroelectric memory 200 according to a second embodiment of the present invention. The second embodiment is different from the first embodiment in that a buried layer 60 is buried between adjacent ferroelectric capacitors FC.

The buried layer 60 gives compression stress to a ferroelectric capacitor FD in a direction perpendicular to the direction of an electric field applied to the ferroelectric capacitor FC. The direction perpendicular to the direction of the electric field is, in other words, a direction perpendicular to a side surface of the ferroelectric capacitor FC, i.e., a direction indicated by an arrow "A" in FIG. 2.

The buried layer 60 may consist of an expansive material. As the material of the buried layer 60, an insulating material or a conductive material may be used. For example, the buried layer 60 may be an oxide film of any one of titanium (Ti), niobium (Nb), molybdenum (Mo), tungsten (W), silicon (Si), and aluminum (Al) or a nitride of any one of these material. More specifically, after the side wall film 30 is formed, any one of polysilazane, SOG (Spin On Glass), polysilicon, and the like are coated to cover the ferroelectric capacitor FC and the side wall film 30. Alternatively, any one of polysilazane, SOG (Spin On Glass), polysilicon, a mixture containing these components, and the like may be deposited on the ferroelectric capacitor FC and the side wall film 30. Thereafter, the deposited material is oxidized or nitrified to expand the material.

In this manner, the buried layer 60 which tends to expands in a direction perpendicular to the side surface of the ferroelectric capacitor FC is formed. More specifically, the buried layer 60 is formed to give compression stress to the side surface of the ferroelectric capacitor FC. The compression stress increases an amount of polarization same as the tensile stress given to the ferroelectric capacitor FC by the side wall film 30. Therefore, the second embodiment can obtain the same effect as that of the first embodiment.

In the second embodiment, the tensile stress in a direction of an electric field generated by the side wall film 30 and the compression stress in the direction perpendicular to the side surface of the ferroelectric capacitor FC generated by the buried layer 60 are combined to each other to make it possible to further increase an amount of polarization of the ferroelectric capacitor FC.

In the second embodiment, an effect of an increase in amount of polarization can also be obtained by using only the compression stress by the buried layer 60. More specifically, a material having no stress may be used as the material of the side wall film 30. Alternatively, the side wall film 30 may be omitted.

In the second embodiment, since an upper electrode TE and a bottom electrode BE are covered with a protecting film 20 and/or the side wall film 30, a conductive material may be used as the material of the buried layer 60. Even though the buried layer 60 consists of the conductive material, the protecting film 20 and/or the side wall film 30 prevent the upper electrode TE and the bottom electrode BE from being short-circuited. When the buried layer 60 is formed as a self-align contact, the buried layer 60 must at least partially consist of a conductive material.

As a material which has conductivity after oxidation or nitrifying, for example, titanium nitride, niobium nitride, tungsten nitride, or the like are known. As a material which has conductivity after oxidation or nitrifying, for example, titanium oxide, niobium oxide, molybdenum oxide, tungsten oxide, a silicon oxide film, a silicon nitride film, alumina, aluminum nitride, or the like are known.

THIRD EMBODIMENT

Figure 3:
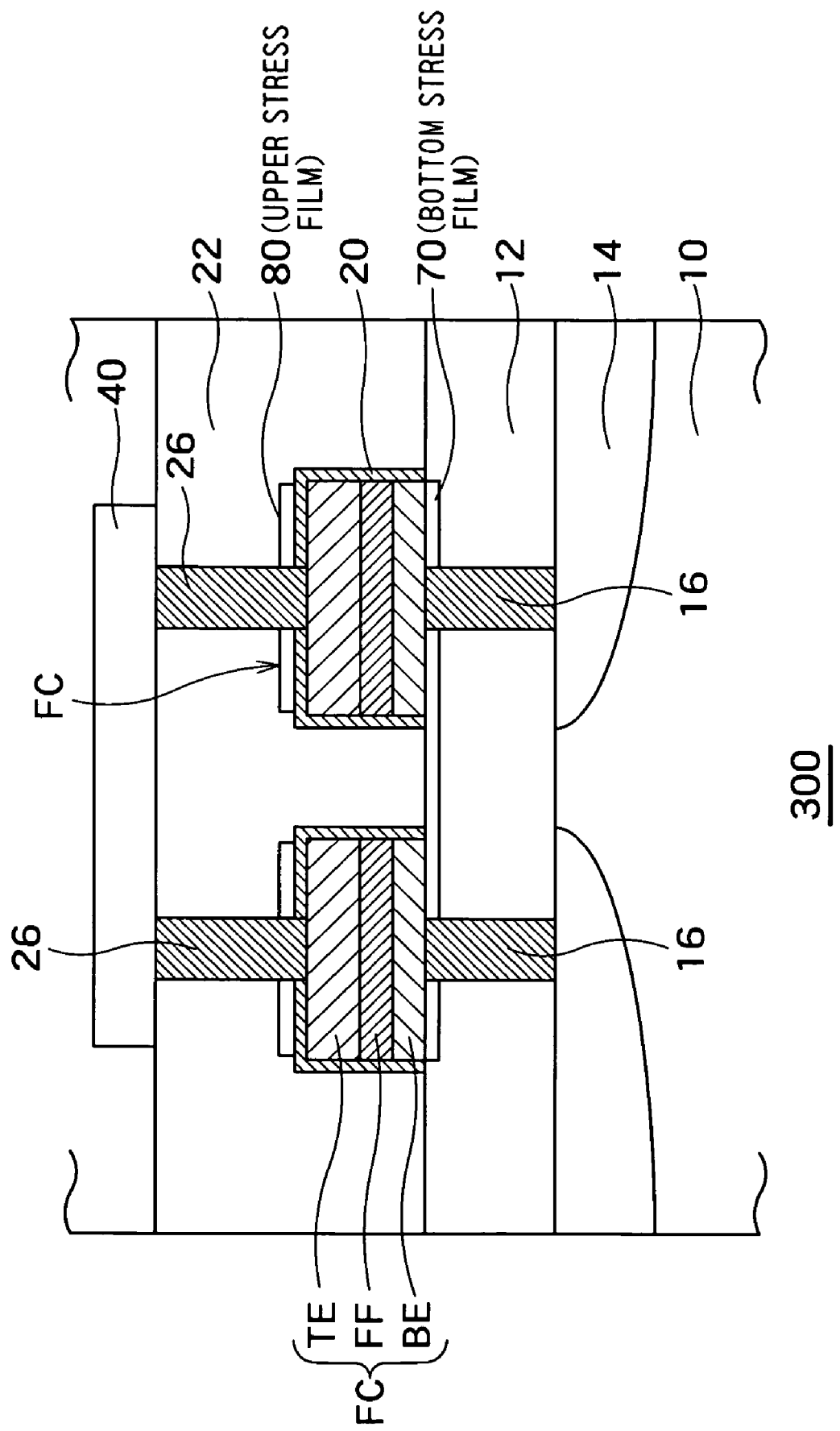
FIG. 3 is a sectional view showing a configuration of a ferroelectric memory 300 according to a third embodiment.

FIG. 3 is a sectional view showing a configuration of a ferroelectric memory 300 according to a third embodiment of the present invention. The third embodiment is different from the first embodiment in that a bottom stress film 70 and an upper stress film 80 are formed.

The bottom stress film 70 and the upper stress film 80 give compression stress to the ferroelectric capacitor FC in a direction perpendicular to a direction (direction of a polarization axis) of an electric field applied to an ferroelectric capacitor FC. The bottom stress film 70 itself and the upper stress film 80 itself receive tensile stress from the ferroelectric capacitor FC.

The upper stress film 80 may consist of, for example, plasma nitride. The plasma nitride, as described above, changes in stress state when a film forming pressure and a plasma power in plasma CVD are changed. By using this, the side wall film 30 is formed under process conditions which give tensile stress to a side wall of the ferroelectric capacitor FC. As the film forming conditions of the plasma nitride having compression stress, a low RF power of 0.3 kW or less, a high pressure, a high discharge frequency of 13.56 MHz are used in an $SiH_4/NH_3/N_2$-based gas. Under the film forming conditions, ion impacts decrease, a residual hydrogen concentration in the film increases, and a film having tensile stress can be formed by thermal treatment, a plasma process, or the like after forming the plasma nitride.

In order to suppress an amount of polarization from being decreased by hydrogen, the upper stress film 80 is formed on the protecting film 20. The upper stress film 80 may be formed on a hard mask (not shown) used in the formation process of the ferroelectric capacitor FC. Alternatively, the hard mask material can also be used as the upper stress film.

When the upper stress film 80 is formed on the hard mask, for example, an oxide film, a protecting film, and a silicon nitride film are sequentially deposited on a material of an upper electrode TE. Then, by using RIE, the laminated film including the oxide film, the protecting film, and the silicon nitride film are processed in the pattern of the hard mask. The materials of the upper electrode TE, a ferroelectric film FF, and a bottom electrode BE are etched by RIE using the laminated film as a hard mask. In this manner, the ferroelectric film FF is formed. The silicon nitride film is left as the upper stress film 80. The upper stress film 80 may be plasma nitride. However, the upper stress film 80 may be a laminated film, a conductive material, or a mixture film.

When the bottom stress film 70 consists of plasma nitride, the bottom stress film 70 may be formed under the film forming conditions having tensile stress as described above. Alternatively, an amorphous oxide film (alumina, titania, hafnia, an Si oxide film, an amorphous high-dielectric-constant film, or the like) may be formed and densified by post thermal treatment such as RTA or RTO. However, when the amorphous oxide is used, the step of contracting a formed ferroelectric film must be performed. The bottom stress film 70 can be formed by a PVD method such as a sputtering method, a CVD method, an applying method, and the like.

In the third embodiment, the upper stress film 80 and the bottom stress film 70 respectively apply compression stress to an upper surface and a bottom surface of the ferroelectric capacitor FC. As a result, an amount of polarization of the ferroelectric capacitor FC increases.

The third embodiment may be combined to the first embodiment or the second embodiment. In this manner, the amount of polarization of the ferroelectric capacitor FC further increases.

In the third embodiment, both the upper stress film 80 and the bottom stress film 70 are formed. However, any one of the upper stress film 80 and the bottom stress film 70 may be formed. In this manner, the steps in manufacturing the ferroelectric memory 300 are reduced.

FOURTH EMBODIMENT

Figure 4:
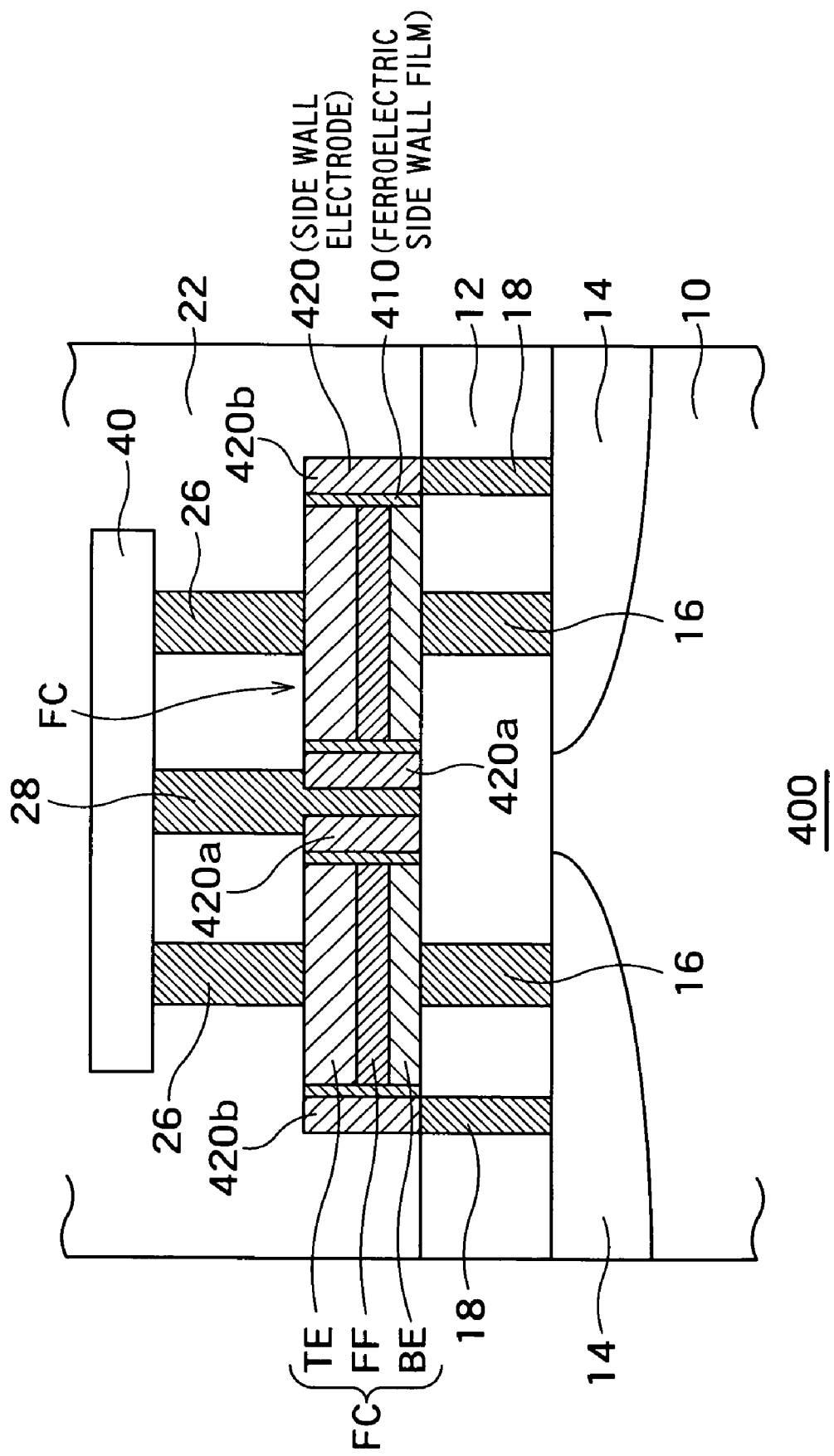
FIG. 4 is a sectional view showing a configuration of a ferroelectric memory 400 according to a fourth embodiment.

FIG. 4 is a sectional view showing a configuration of a ferroelectric memory 400 according to a fourth embodiment of the present invention. The fourth embodiment is different from the first embodiment in that a ferroelectric side wall film 410 and a side wall electrode 420 are formed on a side surface of a ferroelectric capacitor FC in place of the protecting film 20 and the side wall film 30. The other configurations of the fourth embodiment may be the same as those of the first embodiment.

The ferroelectric film FF may be used as an element of a memory to store data. However, the ferroelectric side wall film 410 may be used as a piezoelectric material to give stress to the ferroelectric capacitor FC.

The ferroelectric side wall film 410 covers the side surface of the ferroelectric capacitor. The ferroelectric side wall film 410 may consist of the same ferroelectric material as that of a ferroelectric film FF. As a matter of course, the ferroelectric side wall film 410 may consist of a ferroelectric material different from that of the ferroelectric film FF.

The side wall electrode 420 is formed to be adjacent to the ferroelectric side wall film 410. An electric field is given to the ferroelectric side wall film 410 to cause the ferroelectric side wall film 410 to expand due to the piezoelectric effect. The side wall electrode 420 may consist of a conductive material as that of an upper electrode TE or a bottom electrode BE. As a matter of course, the side wall electrode 420 may consist of a conductive material different from that of the upper electrode TE or the bottom electrode BE.

The ferroelectric side wall film 410 and the side wall electrode 420 are formed as follows. Materials of the ferroelectric side wall film 410 and the side wall electrode 420 are deposited to cover the ferroelectric capacitor FC. The materials of the ferroelectric side wall film 410 and the side wall electrode 420 are anisotropically etched by RIE to leave the ferroelectric side wall film 410 and the side wall electrode 420 on the side wall of the ferroelectric capacitor FC. In this manner, the ferroelectric side wall film 410 and the side wall electrode 420 can be formed.

As shown in FIG. 4, a self-align contact 28 is formed between adjacent upper electrodes TE connected to each other. The self-align contact 28 electrically connect a side wall electrode 420a and an interconnection 40 to each other. The side wall electrode 420a is present between adjacent upper electrodes TE connected to each other through the interconnection 40.

A contact plug 18 is formed on an insulating interlayer 12. The contact plug 18 electrically connects a side wall electrode 420b and an impurity diffusion layer 14 to each other. The side wall electrode 420*b* is present between adjacent bottom electrodes BE connected to each other through the impurity diffusion layer 14.

In an initial state having a history in which no voltage is applied to the upper electrode TE, the bottom electrode BE and the side wall electrode 420, the ferroelectric side wall film 410 does not apply any stress to the ferroelectric capacitor FC. On the other hand, when a voltage is applied to the side wall electrode 420, the upper electrode TE, and the bottom electrode BE, the ferroelectric side wall film 410 expand by a piezoelectric effect caused by an electric field applied between the side wall electrode 420 and the upper electrode TE or the bottom electrode BE. The side wall electrode 420 is fixed by insulating interlayers 12 and 22, so that the ferroelectric side wall film 410 compresses the ferroelectric capacitor FC in a direction perpendicular to a side wall of the ferroelectric capacitor FC. In this manner, as in the second embodiment, an amount of polarization of the ferroelectric capacitor FC can be increased. Therefore, the fourth embodiment can obtain the same effects as those in the first and second embodiment.

The fourth embodiment may combined to the third embodiment. More specifically, in the fourth embodiment, a bottom stress film may be formed under the bottom electrode BE, and/or an upper stress film may be formed above the upper electrode TE. In this manner, the fourth embodiment, the amount of polarization of the ferroelectric capacitor FC can be further increased.

FIFTH EMBODIMENT

Figure 5:
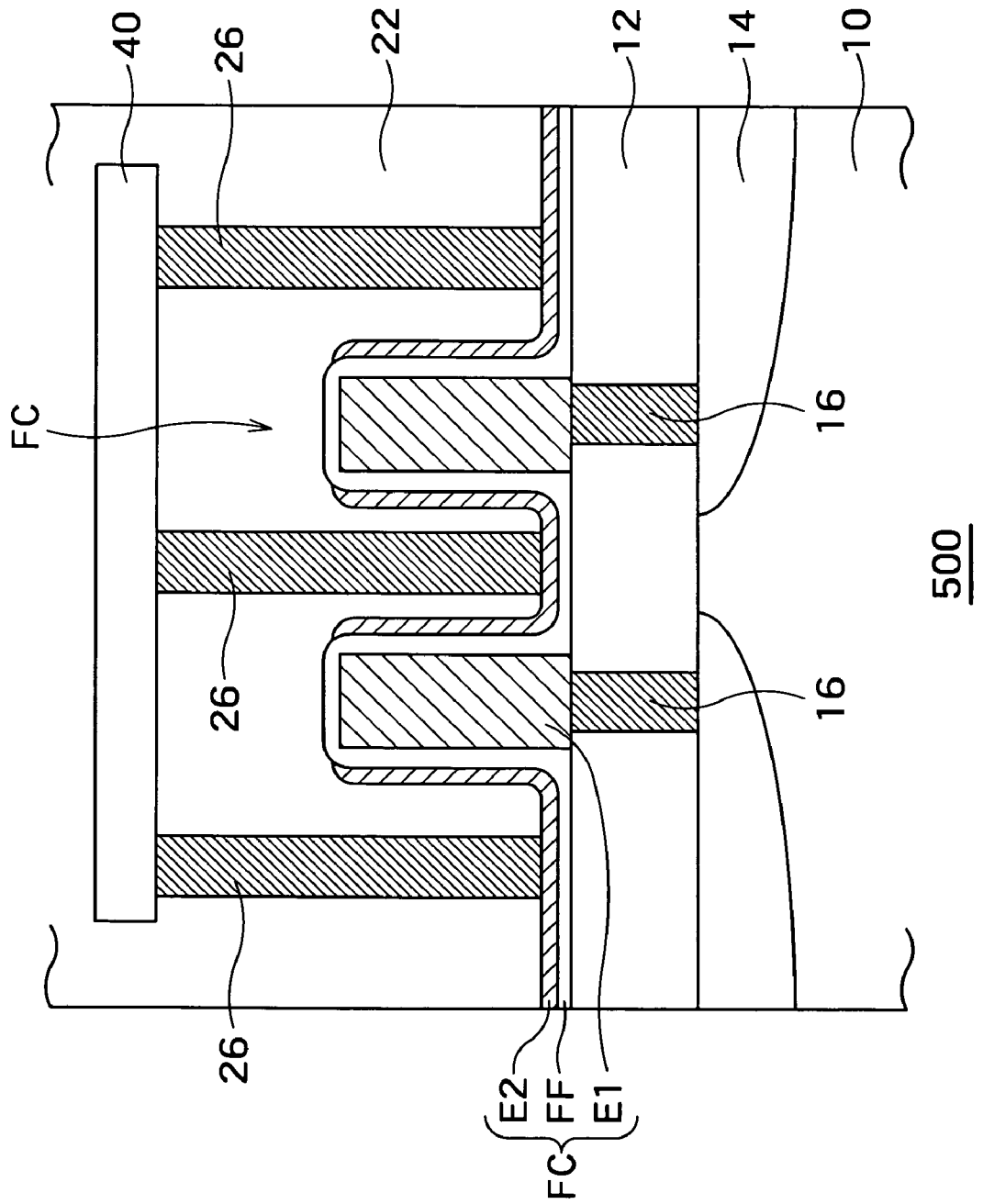
FIG. 5 is a sectional view showing a configuration of a ferroelectric memory 500 according to a fifth embodiment.

FIG. 5 is a sectional view showing a configuration of a ferroelectric memory 500 according to a fifth embodiment of the present invention. The fifth embodiment is different from the first embodiment in that a ferroelectric capacitor FC is stacked in a direction horizontal to the surface of a semiconductor substrate.

The ferroelectric capacitor FC includes a first electrode E1, a ferroelectric film FF, and a second electrode E2. The first electrode E1 may be formed by the same manner as that of the bottom electrode BE in the above embodiments. Alternatively, the first electrode E1 is formed by a plating method. After the first electrode E1 is formed, the ferroelectric film FF is formed by an MOCVD method to cover the first electrode E1. A material of the second electrode E2 is deposited on the ferroelectric film FF. Subsequently, the material of the second electrode E2 on the upper surface of the second electrode E2 is removed by using a lithography technique and RIE or CMP. In this manner, the ferroelectric capacitor FC is formed. The second electrode E2 is formed to be adjacent to the ferroelectric film FF.

The second electrode E2 gives compression stress to the ferroelectric film FF in a direction perpendicular to a direction of an electric field applied to the ferroelectric film FF. The second electrode E2 consists of, for example, conductive perovskite (SRO, LNO, YBCO, SRTO, LSCO, or the like), $RuO_2$, $IrO_2$, or a noble metal such as Pt or Ir. When a conductive oxide is used as the second electrode E2, film formation is performed in an amorphous state, and compression stress is given to a ferroelectric film by crystallization and densification performed by post thermal treatment.

The ferroelectric capacitor FC of the fifth embodiment is obtained by rotating the ferroelectric capacitor FC according to the other embodiments by 90°. In this manner, even if the ferroelectric capacitor FC is changed in direction, a proper stress can be applied to the ferroelectric capacitor FC according to the fifth embodiment. As a result, the amount of polarization of the ferroelectric capacitor FC can be increased.

SIXTH EMBODIMENT

Figure 6:
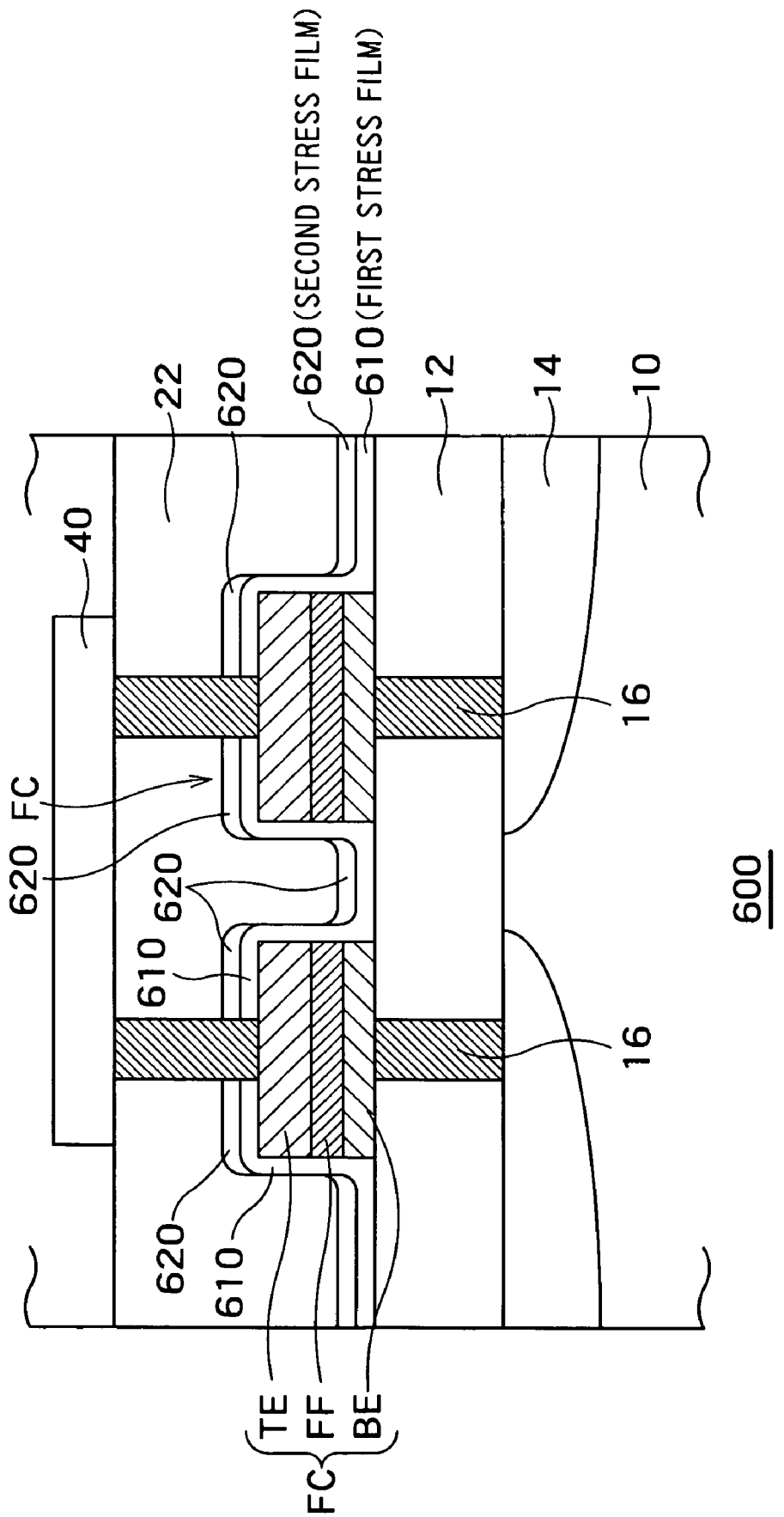
FIG. 6 is a sectional view showing a configuration of a ferroelectric memory 600 according to a sixth embodiment.

FIG. 6 is a sectional view showing a configuration of a ferroelectric memory 600 according to a sixth embodiment of the present invention. The sixth embodiment is different from the first embodiment in that both upper and side surfaces of a ferroelectric capacitor FC are covered with a stress film.

After the ferroelectric capacitor FC is formed, a first stress film 610 is deposited to cover the upper and side surfaces of the ferroelectric capacitor FC. The first stress film 610 consists of alumina ($Al_2O_3$) or plasma nitride deposited by MOCVD (Metal Organic Chemical Vapor Deposition) or ALD (Atomic Layer Deposition). The first stress film 610 has compression stress. Therefore, the first stress film 610 gives tensile stress to the ferroelectric capacitor FC in a parallel direction to a interface between the ferroelectric capacitor FC and the first stress film 610.

A second stress film 620 is sputtered on the upper surface of the ferroelectric capacitor FC. When the second stress film 620 consists of plasma nitride as described above, the second stress film 620 may be formed under film forming conditions having tensile stress. Alternatively, an amorphous oxide film (alumina, titania, hafnia, an Si oxide film, an amorphous high-dielectric-constant film, or the like) may be formed and densified by post thermal treatment such as RTA or RTO. However, when the amorphous oxide is used, the step of contracting a formed ferroelectric film must be performed. Since the second stress film 620 is anisotropically deposited by sputtering, the second stress film 620 is deposited on the upper surface of the ferroelectric capacitor FC, but rarely deposited on the side surface. The second stress film 620 has tensile stress. Therefore, compression stress is given to the ferroelectric capacitor FC and the first stress film 610 in a parallel direction to a interface between the first stress film 610 and the second stress film 620.

Since the second stress film 620 is not deposited on the side surface of the ferroelectric capacitor FC, the first stress film 610 gives tensile stress to the side surface of the ferroelectric capacitor FC. The tensile stress preferably increase an amount of polarization of the ferroelectric capacitor FC.

However, the first stress film 610 gives tensile stress on the upper surface of the ferroelectric capacitor FC. The tensile stress disadvantageously reduces the amount of polarization. Therefore, the second stress film 620 is further deposited on the upper surface of the ferroelectric capacitor FC to moderate or cancel the tensile stress film 610 on the upper surface of the ferroelectric capacitor. In this manner, the amount of polarization of the ferroelectric capacitor FC can be suppressed from decreasing. More preferably, the second stress film 620 gives compression stress larger than the compression stress generated by the first stress film 610 to the upper surface of the ferroelectric capacitor FC. In this manner, the amount of polarization of the ferroelectric capacitor FC can be further increased.

In the sixth embodiment, in formation of the first and second compression films 610 and 620, no photolithography technique and no RIE are necessary. Therefore, the steps in manufacturing the ferroelectric memory 600 can be reduced. Since process damage to the ferroelectric capacitor FC is relatively small, the reliability of the ferroelectric memory 600 is improved.

In the sixth embodiment, the bottom stress film 70 according to the third embodiment may be formed. In this manner, the amount of polarization of the ferroelectric capacitor FC can be further increased.

What is claimed is:

1. A semiconductor device comprising:
   a semiconductor substrate;
   a ferroelectric capacitor arranged above the semiconductor substrate;
   an insulating protecting film covering a side surface of the ferroelectric capacitor; and
   a side wall film formed only on a side surface of the ferroelectric capacitor through the protecting film and giving tensile stress to the ferroelectric capacitor in a direction of an electric field applied to the ferroelectric capacitor, wherein the side wall film has intrinsic compression stress.

2. The semiconductor device according to claim 1, wherein the side wall film is formed a material expanding at the forming process.

3. The semiconductor device according to claim 1, further comprising:
   a plurality of the ferroelectric capacitors arranged above the semiconductor substrate; and
   a buried film buried between the adjacent ferroelectric capacitors and giving compression stress to the ferroelectric capacitors in a direction perpendicular to a direction of an electric field applied to the ferroelectric capacitors.

4. The semiconductor device according to claim 3, wherein the buried film is formed of material expanding at the forming process.

5. A semiconductor device comprising:
   a semiconductor substrate;
   a ferroelectric capacitor having a ferroelectric film between an upper electrode and a bottom electrode and arranged above the semiconductor substrate;
   an upper stress film provided on the upper electrode; and
   a bottom stress film provided under the bottom electrode, wherein
   the bottom stress film is formed of a plasma nitride film, an aluminum oxide film, a titan oxide film, a hafnium oxide film, or an Si oxide film, and
   the upper stress film and the bottom stress film give compression stress to the ferroelectric capacitor in a direction perpendicular to a direction of an electric field applied to the ferroelectric capacitor.

6. The semiconductor device according to claim 5 further comprising:
   an insulating protecting film covering a side surface of the ferroelectric capacitor; and
   a side wall film which is adjacent to the side surface of the ferroelectric capacitor through the protecting film and which gives tensile stress to the ferroelectric capacitor in the direction of the electric field applied to the ferroelectric capacitor.

7. The semiconductor device according to claim 5 further comprising:
   a plurality of the ferroelectric capacitors; and
   a buried film buried between the adjacent ferroelectric capacitors and giving compression stress to the ferroelectric capacitors in a direction perpendicular to a direction of an electric field applied to the ferroelectric capacitors.

8. The semiconductor device according to claim 6 further comprising:
   a plurality of the ferroelectric capacitors; and
   a buried film buried between the adjacent ferroelectric capacitors and giving compression stress to the ferroelectric capacitors in a direction perpendicular to a direction of an electric field applied to the ferroelectric capacitors.

9. A semiconductor device comprising:
   a semiconductor substrate;
   a ferroelectric capacitor arranged above the semiconductor substrate;
   piezoelectric films provided on the side surfaces of the ferroelectric capacitor and applying stress to the ferroelectric capacitor from the side surfaces of the ferroelectric capacitor; and
   side wall electrodes provided on the side surfaces of the ferroelectric capacitor via the piezoelectric films and giving an electric field to the piezoelectric films to expand the piezoelectric films, wherein
   one of the side wall electrodes provided on a side surface of the ferroelectric capacitor is electrically connected to one of electrodes of the ferroelectric capacitor, and
   the other of the side wall electrodes provided on the other side surface of the ferroelectric capacitor is electrically connected to the other of electrodes of the ferroelectric capacitor.

10. The semiconductor device according to claim 9, wherein
    the ferroelectric capacitor has a ferroelectric film between an upper electrode and a bottom electrode, and
    the semiconductor device further comprising:
    an upper stress film provided on the upper electrode; and
    a bottom stress film provided under the bottom electrode, wherein
    the upper stress film and the bottom stress film give compression stress to the ferroelectric capacitor in a direction perpendicular to a direction of an electric field applied to the ferroelectric capacitor.

11. A semiconductor device comprising:
    a semiconductor substrate;
    a ferroelectric capacitor arranged above the semiconductor substrate;
    a first stress film covering a upper surface and side surfaces of the ferroelectric capacitor and giving tensile stress to the ferroelectric capacitor; and
    a second stress film on the first stress film covering an upper surface of the ferroelectric capacitor, but not covering side surfaces of the ferroelectric capacitor, the second stress film giving compression stress on the first stress film to moderate the tensile stress of the first stress film on the upper surface of the ferroelectric capacitor.

12. The semiconductor device according to claim 11, wherein
    the ferroelectric capacitor has a ferroelectric film between an upper electrode and a bottom electrode, and
    the semiconductor device further comprising:
    an upper stress film provided on the upper electrode; and
    a bottom stress film provided under the bottom electrode, wherein
    the upper stress film and the bottom stress film give compression stress to the ferroelectric capacitor in a direction perpendicular to a direction of an electric field applied to the ferroelectric capacitor.

13. A method of manufacturing a semiconductor device comprising:
    depositing an insulating film on a semiconductor substrate;
    forming a contact on the insulating film;

forming a ferroelectric capacitor by sequentially depositing a lower electrode, a ferroelectric film, and an upper electrode on the contact;
isotropically depositing a first stress film giving tensile stress on upper and side surfaces of the ferroelectric capacitor in a parallel direction to a interface between the ferroelectric capacitor and the first stress film; and
anisotropically depositing a second stress film giving compression stress on the upper surface of the ferroelectric capacitor, but not on side surfaces of the ferroelectric capacitor, to moderate the tensile stress of the first stress film on the upper surface of the ferroelectric capacitor.

14. The method of manufacturing a semiconductor device according to claim 13, wherein the first stress film is deposited by using MOCVD or ALD, and the second stress film is deposited by using sputter process.

15. The semiconductor device according to claim 9, wherein the one of the side wall electrodes is electrically connected to an upper electrode of the ferroelectric capacitor through a wiring connected to the upper electrode, and the other of the side wall electrodes is electrically connected to a bottom electrode of the ferroelectric capacitor through a wiring connected to the bottom electrode.

* * * * *